United States Patent
Liao et al.

(10) Patent No.: US 9,088,291 B2
(45) Date of Patent: Jul. 21, 2015

(54) USB APPARATUS

(75) Inventors: Chun-Ting Liao, Chang-Hua (TW);
An-Ming Lee, Hsin-Chu Hsien (TW);
Jun-Jie Xie, Suzhou (CN); Ying-Hui Zhu, Suzhou (CN)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 1484 days.

(21) Appl. No.: 11/552,135

(22) Filed: Oct. 23, 2006

(65) Prior Publication Data
US 2007/0174727 A1 Jul. 26, 2007

(30) Foreign Application Priority Data
Oct. 24, 2005 (CN) .......................... 2005 1 0114106

(51) Int. Cl.
*G06F 11/00* (2006.01)
*H03L 7/197* (2006.01)
*H04L 7/04* (2006.01)

(52) U.S. Cl.
CPC ............... *H03L 7/1976* (2013.01); *H04L 7/041* (2013.01)

(58) Field of Classification Search
CPC .............. G06F 11/076; G06F 11/0757; G06F 11/0793; H03L 7/1967; H04L 7/041
USPC ................................ 714/43, 55, 56
See application file for complete search history.

(56) References Cited

U.S. PATENT DOCUMENTS

| 5,933,611 A * | 8/1999 | Shakkarwar .................. 710/100 |
| 6,219,736 B1 * | 4/2001 | Klingman ..................... 710/315 |
| 6,343,364 B1 * | 1/2002 | Leydier et al. ................ 713/500 |
| 7,093,151 B1 * | 8/2006 | Williams ....................... 713/500 |
| 2004/0088445 A1 * | 5/2004 | Weigold et al. .................... 710/8 |
| 2004/0148539 A1 * | 7/2004 | Leydier et al. ................ 713/500 |
| 2005/0080935 A1 * | 4/2005 | Fukae et al. ....................... 710/1 |
| 2006/0123176 A1 * | 6/2006 | Fredriksson et al. ......... 710/305 |
| 2007/0079166 A1 | 4/2007 | Okada |

FOREIGN PATENT DOCUMENTS

| CN | 1940808 | 4/2007 |
| EP | 1 445 681 A2 | 8/2004 |
| KR | 10-2004-009745 | 11/2004 |
| WO | WO 2004/059902 A2 | 7/2004 |

OTHER PUBLICATIONS

Universal Serial Bus Specification, by: Compaq, Hewlett-Packard, Intel, Lucent, Microsoft, NEC, Philips Revision 2.0 Apr. 27, 2000.*

* cited by examiner

*Primary Examiner* — Yair Leibovich
(74) *Attorney, Agent, or Firm* — McClure, Qualey & Rodack, LLP

(57) ABSTRACT

The present invention disclosed a Universal Serial Bus (USB) apparatus. The apparatus includes: a signal detecting unit for detecting a packet signal transmitted from a USB host and generating an acknowledgment signal according to a detection result; an error detecting unit, coupled to the signal detecting unit, for generating a control signal according to the acknowledgment signal; and a frequency generating unit, coupled to the error detecting unit, for generating an output clock signal according to the control signal.

18 Claims, 10 Drawing Sheets

USB APPARATUS

BACKGROUND OF THE INVENTION

1. Field of the Invention

The present invention is related to a Universal Serial Bus (USB) apparatus and a method thereof, and more particularly, to a Universal Serial Bus (USB) apparatus without an accurate frequency oscillator and method thereof.

2. Description of the Prior Art

Universal Serial Bus (USB) is a common serial transmitting interface utilized in computer systems. It is very convenient for USB to establish connections in a high transmission speed (e.g., 480 Mbps of USB 2.0). Therefore, USB is becoming a very popular transmitting interface, and almost every apparatus available on the market today is compatible with the USB protocol to provide a connecting interface with computer systems, such as portable card readers, portable storage apparatus, and scanners.

Normally, the transmitting frequency of the USB interface is required to have an accurate operating frequency. When operated at low-speed or full-speed (LS/FS) mode, the frequency error must be less than +/−2500 ppm, and when in high-speed (HS) mode, the frequency error must be less than +/−500 ppm. Therefore, an accurate oscillating signal source external to the USB chip is utilized to provide an accurate frequency to the USB chip to achieve the requirement of the frequency error. FIG. 1 illustrates a USB system 10 including a USB host 12, a USB apparatus 14 and an accurate oscillating signal source 16 such as a crystal oscillating component. A special oscillating apparatus can also be utilized to obtain the desired frequency accuracy.

However, the cost of the above-mentioned special oscillating apparatus is very high. Therefore, in the low-cost application fields, to develop a USB chip that does not require the accurate external oscillating signal source is very important.

SUMMARY OF THE INVENTION

It is therefore an objective of the present invention to provide a Universal Serial Bus (USB) apparatus that does not require an external accurate frequency oscillator and method thereof, to reduce the manufacturing costs without affecting the product performance.

According to the present invention, a Universal Serial Bus (USB) apparatus is disclosed. The apparatus includes: a signal detecting unit for detecting a packet signal transmitted from a USB host and generating an acknowledgment signal according to a detection result; an error detecting unit, coupled to the signal detecting unit, for generating a control signal according to the acknowledgment signal; and a frequency generating unit, coupled to the error detecting unit, for generating an output clock signal according to the control signal.

According to the present invention, a Universal Serial Bus (USB) system is disclosed. The system includes: a USB apparatus for receiving a packet signal transmitted from a USB host and generating a control signal, and a frequency generating unit coupled to the USB apparatus, for generating an output clock signal according to the control signal, wherein the frequency generating unit includes a reference clock generator for generating a first clock signal.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4($b$) is diagram illustrating a state machine operating in FS mode corresponding to FIG. 4($a$).

DETAILED DESCRIPTION

Certain terms are used throughout the following description and claims to refer to particular system components. As one skilled in the art will appreciate, consumer electronic equipment manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
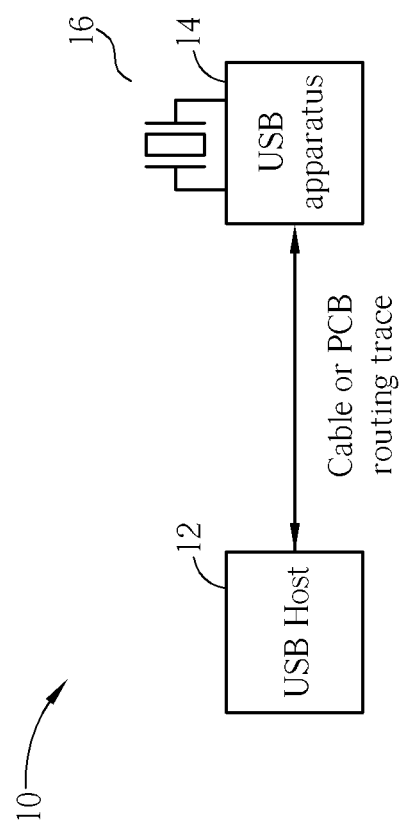
FIG. 1 is a diagram illustrating a prior art USB apparatus with an external oscillating component.
Figure 2:
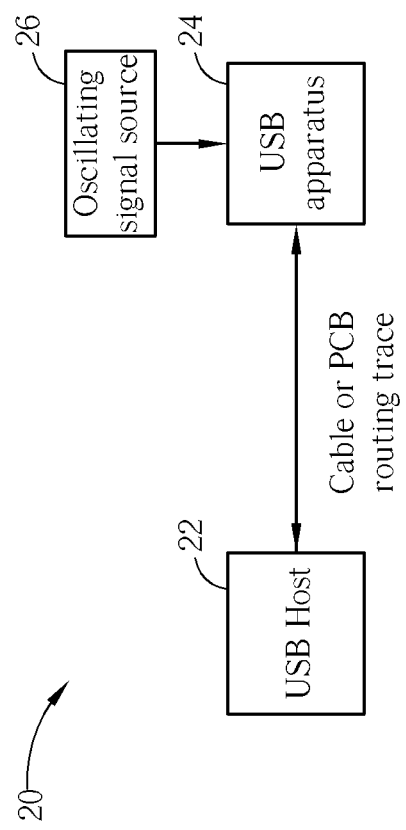
FIG. 2 is a diagram illustrating a system diagram of an USB system according to the present invention.

Please refer to FIG. 2. FIG. 2 illustrates a system diagram of a USB system 20 according to the present invention. In FIG. 2, a USB host 22, such as a personal computer, transmits a signal to the attached USB apparatus 24, which is coupled to an oscillating signal source 26, through a cable or PCB routing trace. The transmitting period of the signal varies according to the USB operating mode.

Figure 3:
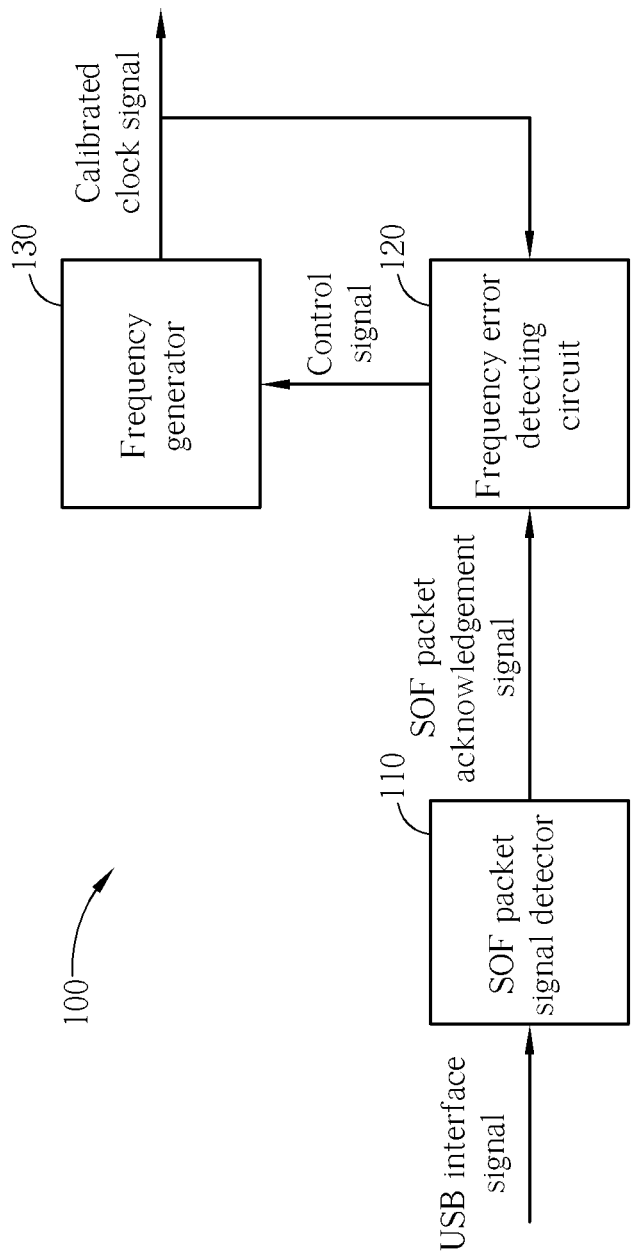
FIG. 3 is a diagram illustrating a functional block diagram of a USB apparatus according to an embodiment of the present invention.

Please refer to FIG. 3. FIG. 3 illustrates a functional block diagram of a USB apparatus 100 according to an embodiment of the present invention. In FIG. 3, the USB apparatus 100 includes a "Start of Frame" (SOF) packet signal detector (SOF detector) 110; a frequency error detecting circuit 120 coupled to the SOF packet signal detector 110; and a frequency generator 130 coupled to the frequency error detecting circuit 120. The functionality and operation of each component in USB apparatus 100 of the present invention will be explained in details in the following paragraph.

The SOF signal is a specific periodic packet signal defined in the USB protocol. The USB host transmits the SOF packet signal to the attached USB apparatus through a cable or PCB routing trace every predetermined time interval, and the transmitting period of the SOF packet signal varies with the USB operating mode. In low-speed or full-speed (LS/FS) mode, the period is 1 ms+/−2500 ppm; however, in HS mode the period is reduced to 125 us+/−500 ppm. Accordingly, if the USB apparatus is capable of precisely detecting the SOF packet signal under various of operating modes, the SOF packet signal can be utilized as a reference clock signal of the system. Therefore, the system can utilize the period of the SOF packet signal to calibrate the internal operating frequency.

For the detecting operation, there are various different detecting methods for the FS/FS mode and HS mode. A brief description is provided as below.

Figure 4A:
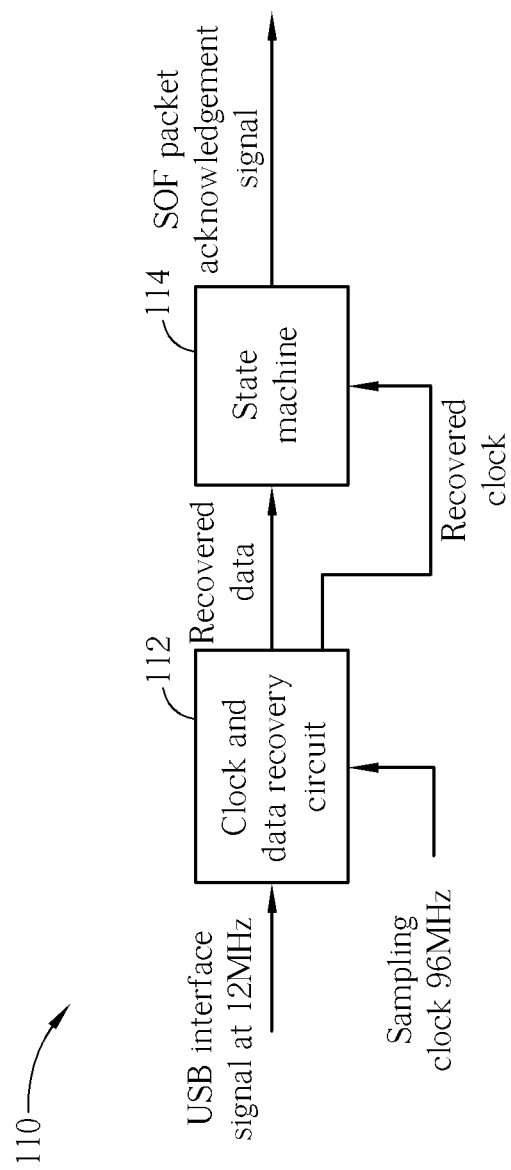
FIG. 4($a$) is a diagram illustrating an SOF detector according to an embodiment of the present invention.

Please refer to FIG. 4(a) for reference to a first method of detecting the SOF packet signal in the LS/FS mode. FIG. 4(a) is a diagram illustrating the SOF detector 110 according to an embodiment of the present invention. The SOF detector 110 includes a clock and data recovery circuit 112, and a state machine 114. The method of over-sampling is utilized for detecting the SOF packet signal because the transmitting rate of the LS mode is 1.5 Mbits/sec, and the transmitting rate of FS mode is 12 Mbits/sec.

Figure 4B:
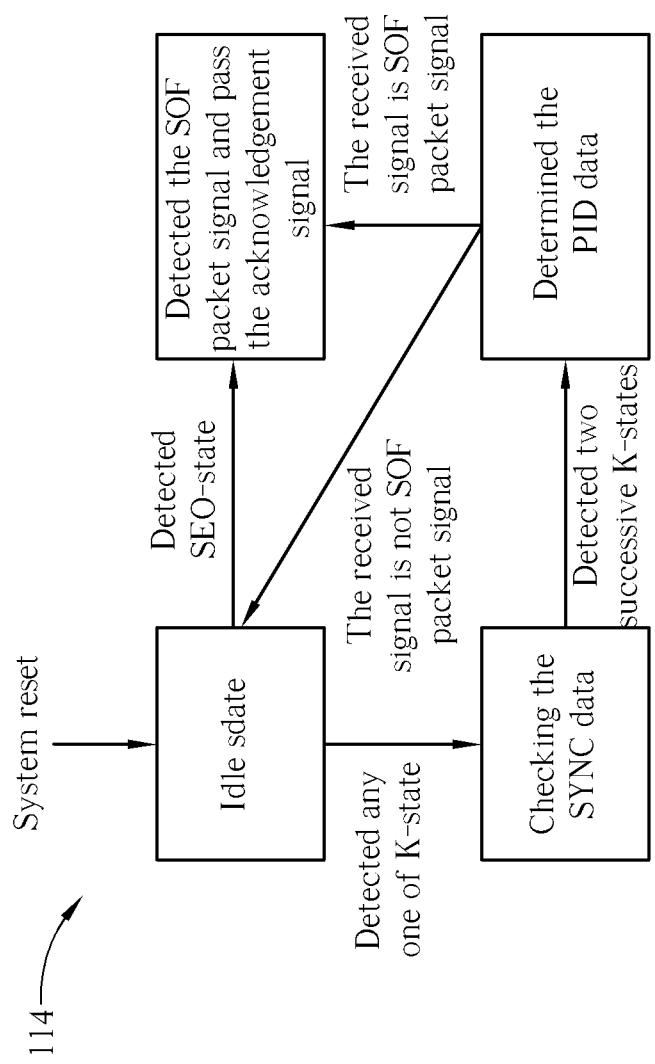

In FIG. 4(a), a signal received from a USB cable or PCB routing trace is transmitted to the clock and data recovery circuit 112 that operates under 96 MHz, and the corresponding recovered clock and recovered data can be obtained. Then, referring to FIG. 4(b) for reference to a state machine operating in FS mode, the corresponding recovered clock and recovered data is transmitted to the following state machine 114 for further analysis to determine whether the received signal is an SOF packet signal or not. If the received signal is a SOF packet signal, an acknowledgment signal is generated and passed to the next circuit.

Figure 5:
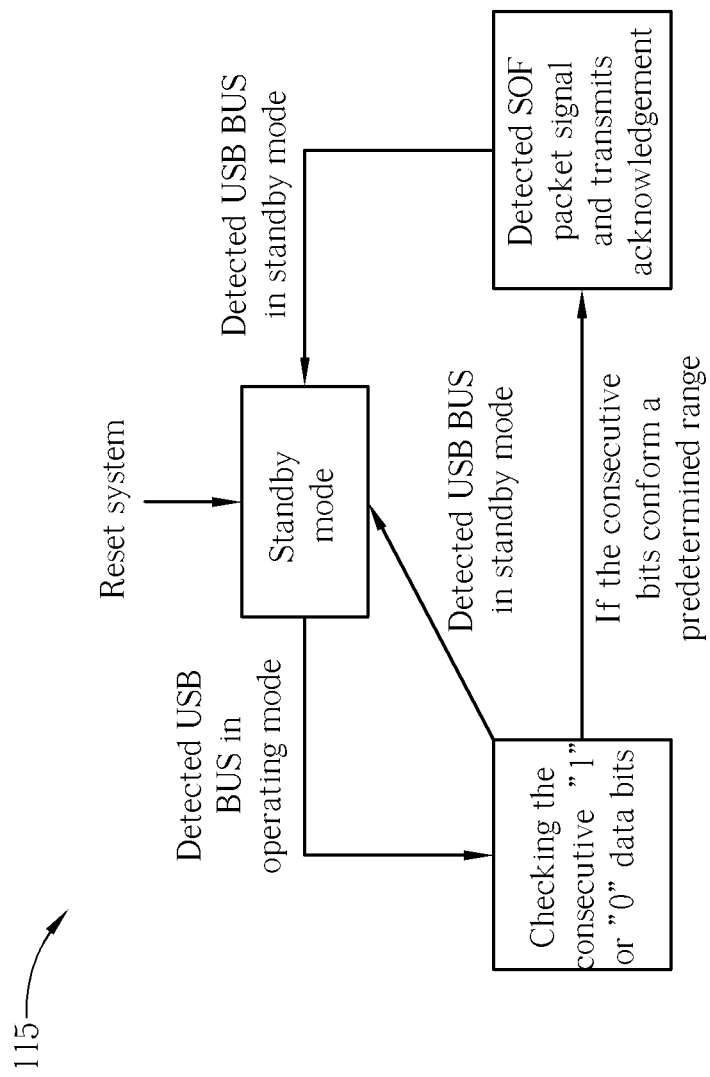
FIG. 5 is a diagram illustrating a state machine operating in HS mode according to an embodiment of the present invention.

Please refer to FIG. 5 for reference to a second method of detecting the SOF packet signal in the HS mode. FIG. 5 shows a diagram illustrating the state machine 115 operating in the HS mode according to an embodiment of the present invention. In the HS mode, the transmitting rate is 480 Mbits/sec, thus the method of over-sampling is inadequate for detecting the SOF packet signal. However, each SOF packet signal in the HS mode will have a consecutive 40-bit data which includes continuous 0's or 1's, the so-called End of Packet (EOP). Normally, there are at most seven consecutive bits of 0's or 1's due to data encoding algorithm in a data packet signal. Therefore, by detecting a specific low frequency of 0's or 1's signal, the existence of the SOF in HS mode can be identified.

In FIG. 5, the received signal in HS mode is analyzed by the state machine 114, and the currently received signal can also be identified to be a SOF packet signal or not. If the currently received signal is a SOF packet, an acknowledgment signal is generated and passed to the next circuit.

Figure 6:
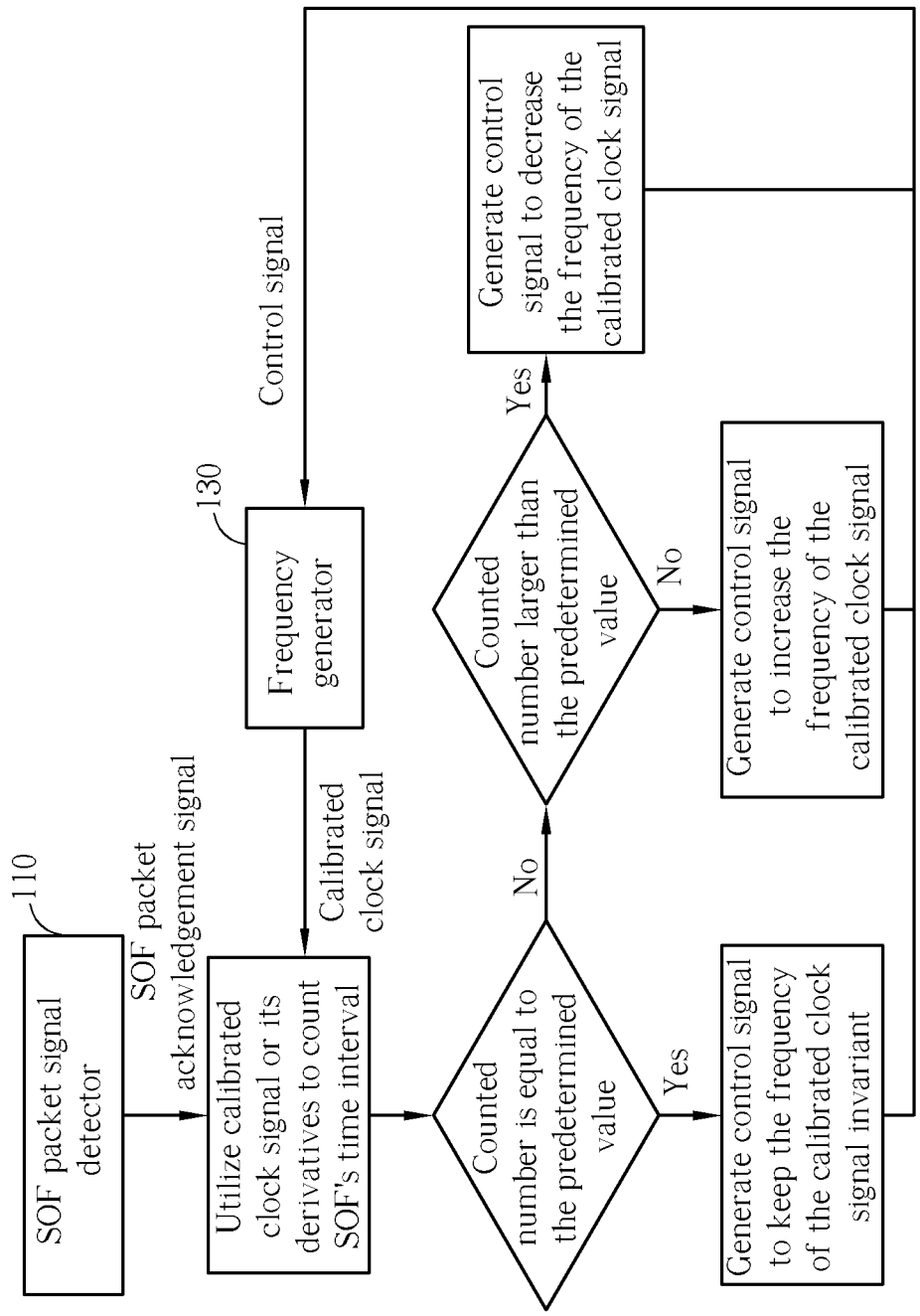
FIG. 6 is a diagram illustrating an algorithm of a frequency error detecting circuit according to an embodiment of the present invention.

Please refer to FIG. 6. FIG. 6 is a diagram illustrating an algorithm of the frequency error detecting circuit 120 according to an embodiment of the present invention. As mentioned above, a periodic SOF packet acknowledgment signal can be obtained by the SOF packet signal detector 110. If a controllable oscillating signal source can be utilized to count the time interval between two adjacent SOF packet acknowledgment signals, the output frequency of the oscillating signal source can be adjusted in accordance with the counting result to achieve the objective of calibrating the frequency. According to the algorithm, a control signal can be obtained for adjusting the output frequency of the above mentioned oscillating signal source. Furthermore, as the periods of the SOF packet signal in the LS/FS mode are different from the periods of the SOF packet signal in the HS mode, the methods of calibrating the frequency are slightly different as well.

The frequency calibrating method of the LS/FS mode is as provided below for reference:

(a) the period of the SOF packet signal in the LS/FS mode is 1 ms+/−2500 ppm;

(b) suppose that the frequency of the clock signal used for counting is 60 MHz;

(c) within every 1 ms of time interval, the oscillating signal source generates 1 ms*60 MHz=60,000 cycles of clock signal for counting; and (d) every cycle of the clock signal used for counting can be represented as a $1/60,000$=16.7 ppm of frequency error.

Additionally, the frequency calibrating method of the HS mode is as provided below:

(a) the period of the SOF packet signal in the HS mode is 125 us+/−500 ppm;

(b) suppose that the frequency of the clock signal used for counting is 480 MHz;

(c) within every 125 us of time interval, the oscillating signal source generates 125 us*480 MHz=60,000 cycles of clock signal for counting; and (d) every cycle of the clock signal used for counting can be represented as a $1/60,000$=16.7 ppm of frequency error.

As mentioned above, if the cycle number of the clock signal generated by the oscillating signal source is less than a predetermined value during a time interval between two adjacent SOF packet signals, the generated control signal will indicate that the oscillating signal source must slightly increase the frequency of the output clock. Otherwise, if the cycle number of the clock signal generated by the oscillating signal source is greater than a predetermined value during the time interval between two adjacent SOF packet signals, the generated control signal will indicate that the oscillating signal source must slightly decrease the frequency of the output clock. Accordingly, by the feedback mechanism described, the frequency accuracy of the output clock of the oscillating signal source is close to the frequency accuracy of the incoming SOF packet signal.

The frequency (i.e., the calibrated frequency of the clock signal) is synchronized to the frequency of the incoming SOF packet signal whenever the counting result is equal to the predetermined value. Under this condition, a clock signal that precisely synchronized with the operating clock of USB host is generated and can be utilized in the following data processing.

Furthermore, if the calibration time needs to be reduced, an acceptable tolerance range of frequency error can be set. If the difference between the counted cycle number of the clock signal and the predetermined value is smaller than the acceptable tolerance range of frequency error, the frequency error between the two signals is very small, and the calibrated clock signal is capable of being utilized in the subsequent data processing. The calibrating procedure can thus be stopped.

Figure 7:
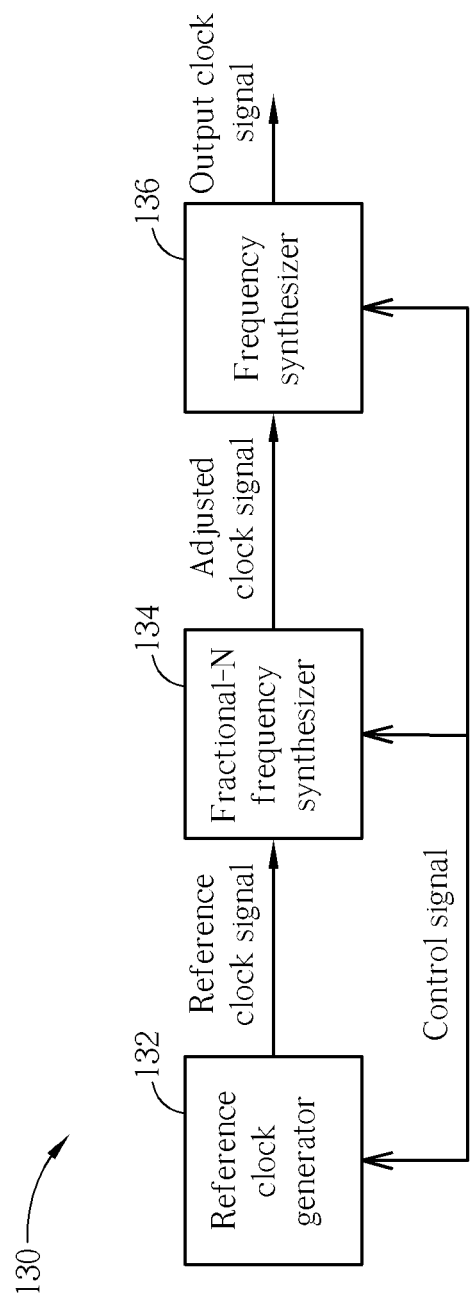
FIG. 7 is a diagram illustrating a frequency generator according to an embodiment of the present invention.

Please refer to FIG. 7. FIG. 7 is a diagram illustrating a frequency generator 130 with high frequency resolution according to an embodiment of the present invention. The purpose of the frequency generator 130 is for implementing the above mentioned controllable oscillating signal source. Furthermore, as the resolution of the output frequency of the frequency generator 130 is directly related to the precision of the frequency calibration result, the resolution of the output frequency of the frequency generator 130 must be as high as possible to increase the frequency precision of the calibrated clock signal.

The frequency generator 130 includes a reference clock generator 132, a fractional-N frequency synthesizer 134, and a frequency synthesizer 136.

(1) Reference Clock Generator 132

The reference clock generator 132 is for generating a clock signal source as a reference clock of the subsequent fractional-N frequency synthesizer 134. Normally, a clock generator is implemented by combining of a resistor (R), a capacitor (C), an inductor (L), or other circuit components, and the generated clock frequency is dependent on the value of the respective resistance, capacitance, and inductance. If the R/L/C components are made off-chip, a more accurate resistance, capacitance, or inductance can be obtained (e.g., the error is less than +−10%, or 5%) due to precise components selected by a system manufacturer, and which results in an accurate output frequency. However, if the R/L/C components are made on-chip, the resulting resistance, capacitance, or inductance are less accurate (e.g., the error is greater than +/−20%) due to manufacturing process variation, and which results in a less accurate output frequency of the reference clock generator 132 (e.g., the error might be as high as +/−30%).

Furthermore, a ring oscillator can be utilized to design the reference clock generator 132. Thus the frequency of the output clock signal of the generated clock signal source is related to the propagation delay of each inverter. Accordingly, if the inverter is designed as an on-chip component, the frequency of the output clock signal will be influenced significantly by the conditions of the manufacturing process. In other words, the manufacturing sensitivity is high.

Figure 8:
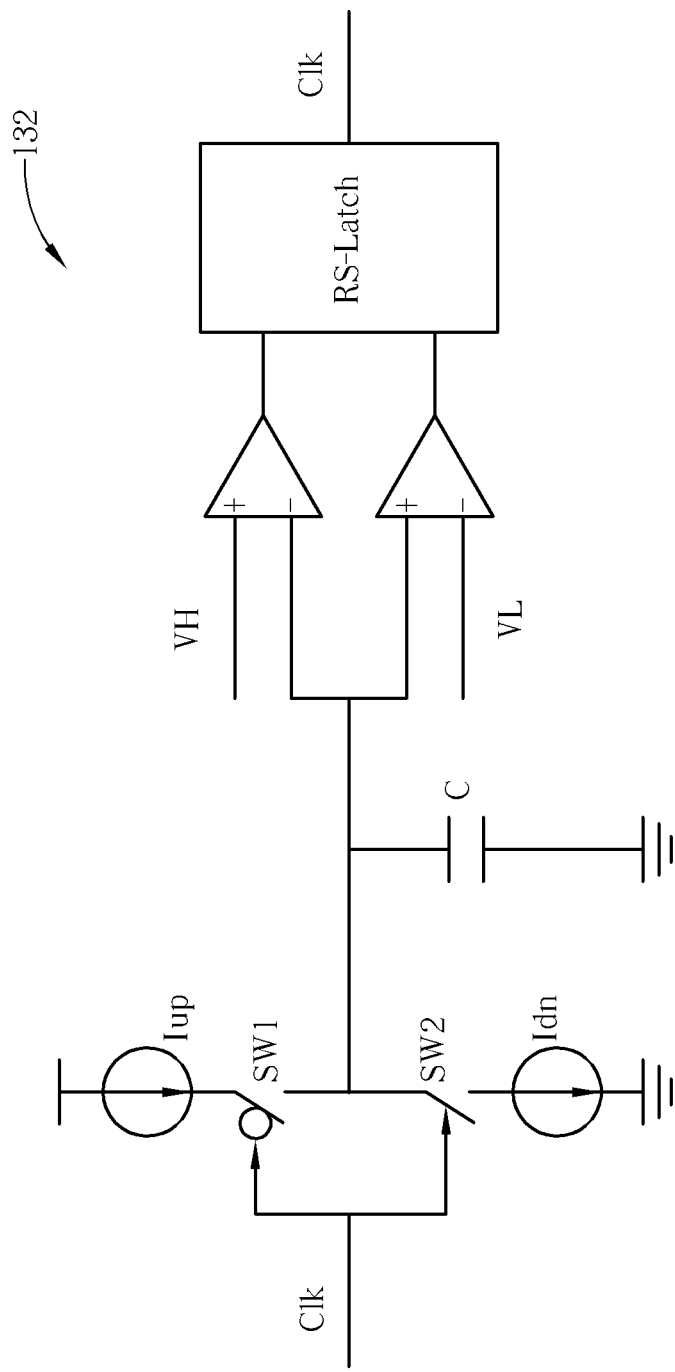
FIG. 8 is a diagram illustrating a reference clock generator.

Please refer to FIG. 8. FIG. 8 is a diagram illustrating the reference clock generator 132 shown in FIG. 7. The reference clock generator 132 generates a reference frequency by adopting a capacitor and a ring oscillator, and which periodically oscillate due to the charging/discharging manner of the capacitor. The reference frequency determined by this configuration is related to the capacitance, the charging/discharging current, and the manufacturing process variation.

(2) Fractional-N Frequency Synthesizer 134

Figure 9:
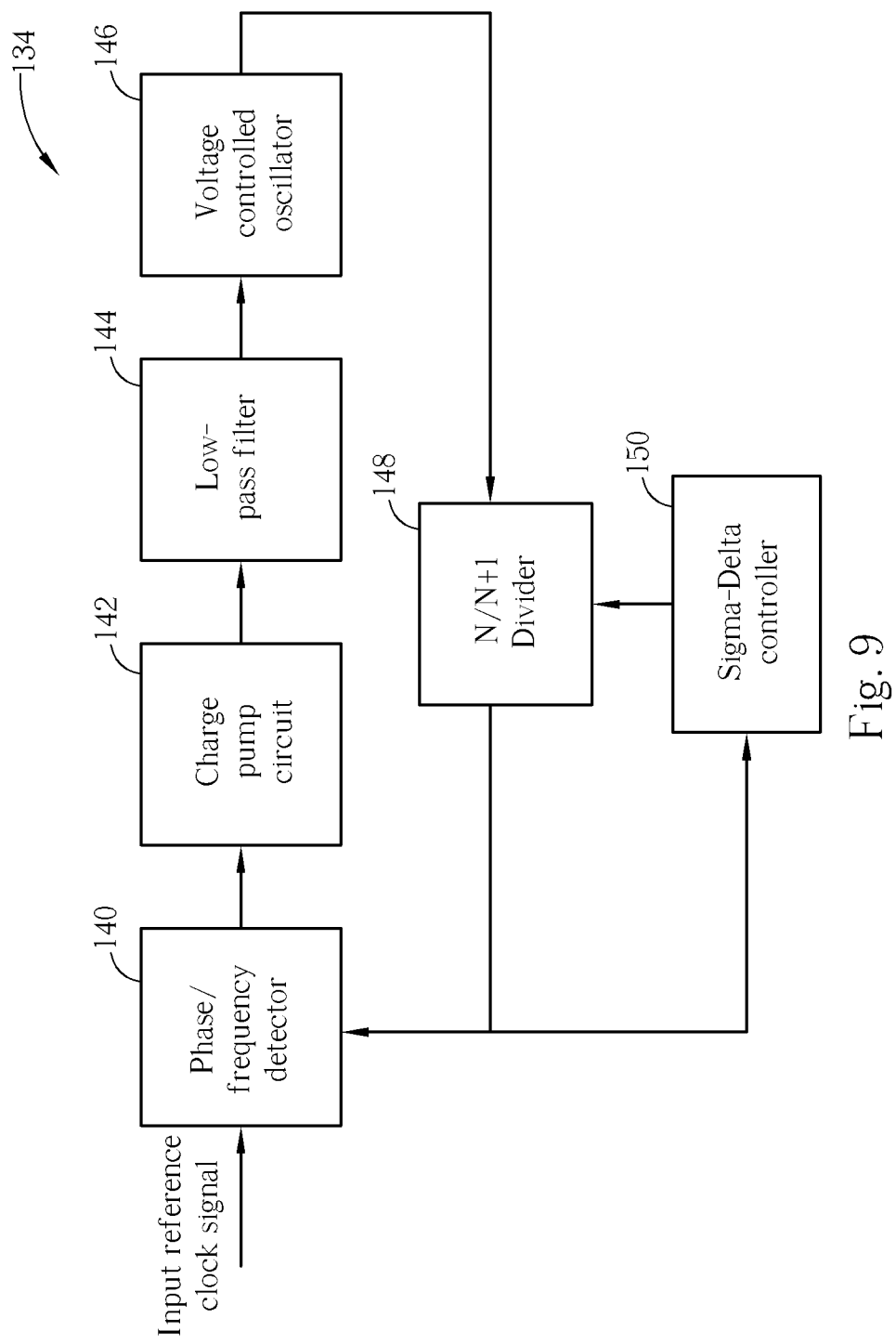
FIG. 9 is a diagram illustrating a fractional-N frequency synthesizer.

Please refer to FIG. 9. FIG. 9 is a diagram illustrating a fractional-N frequency synthesizer 134. The fractional-N frequency synthesizer 134 includes a phase/frequency detector 140, a charge pump circuit 142, a low-pass filter 144, a voltage controlled oscillator 146, an N/N+1 divider 148, and a sigma-delta controller 150. Compared with the traditional frequency synthesizer, the fractional-N frequency synthesizer 134 is able to fine-tune the frequency of the output clock signal while the frequency of the input reference clock signal remains unchanged. For example, when the frequency of the input reference clock signal is 12 MHz, the frequency of the output clock signal can be fine-tuned from 480 MHz to 480.1 MHz or other frequency closed to 480 MHz. In other words, if the fractional-N frequency synthesizer 134 is cascaded to the reference clock generator 132, an oscillating signal source with a very high resolution of frequency can be obtained.

(3) Frequency Synthesizer 136

Although the above-mentioned fractional-N frequency synthesizer 134 is capable of generating an adjusted clock signal with very high resolution of frequency, a higher clock jitter is also generated. In the field of communication, the high clock jitter is a significant problem. Thus, high frequency resolution and low clock jitter are required. A frequency synthesizer 136 is also utilized to filter the generated clock signal from the fractional-N frequency synthesizer to assure that the performance of the clock jitter conforms the required specification. If the generated clock signal of the fractional-N frequency synthesizer 134 meets the required specification, the frequency synthesizer 136 can be omitted.

There are various frequency generating means. For example, the output frequency can be changed by only adjusting the divider of the fractional-N frequency synthesizer 134 while the reference clock frequency keeps unchanged. The output frequency can be changed by adjusting the reference clock frequency while the divider of fractional-N frequency synthesizer 134 is unchanged. Moreover, the output frequency can also be changed by adjusting frequency of the reference clock and the divider of fractional-N frequency synthesizer 134 simultaneously, or even the divider of the frequency synthesizer 136.

Therefore, if frequency generator 130 cooperates with the frequency error detecting circuit 120, the periodic SOF packet signal can be utilized for calibrating the error of the output frequency of the frequency generator, and the frequency error can be controlled to meet the USB specification such that the system can work properly. The calibrated clock signal that transmitted to the frequency error detecting circuit 120 can be generated by the clock signal from the fractional-N frequency synthesizer 134 or from frequency synthesizer 136.

According to the disclosure of the present invention, the conventional precise oscillating signal source 16, such as the crystal oscillating component, can be replaced by an oscillating signal source consisting of the combination of passive components, such as resistors (R), capacitors (C), or inductors (L), and associated active components, such as current sources and comparators to achieve the goal of lower production cost while maintaining good frequency accuracy. Furthermore, the oscillating signal source formed by a ring oscillator also can operate correctly as expected. The above-mentioned resistors, capacitors, inductors, or other associated components are not restricted to be off-chip components, but also can be fabricated on-chip for reducing the manufacturing costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A Universal Serial Bus (USB) apparatus, comprising:
a signal detecting unit, for detecting a packet signal transmitted from a USB host and generating an acknowledgment signal in response to a detection result indicating that the packet signal is a start of frame (SOF) packet signal;
an error detecting unit, coupled to the signal detecting unit, for utilizing an output clock signal to count a time interval between two adjacent acknowledgment signals to generate a counting result and generating a control signal according to the counting result, the output clock signal comprising a per interval quantity of clock cycles equal to a product of the time interval and a frequency of the output clock signal; and
a frequency generating unit, coupled to the error detecting unit for generating the output clock signal according to the control signal, wherein the frequency generating unit comprises:
a reference clock generator, for generating a reference clock signal; and
a fractional-N frequency synthesizer, for generating an adjusted clock signal according to the reference clock signal and the control signal, the fractional-N frequency generator comprising a charge pump and a sigma-delta controller.

2. The USB apparatus of claim 1, wherein the signal detecting unit comprises:
   a recovery unit, for generating at least a recovered signal according to the packet signal and based on an oversampling method according to operation in an LS/FS mode; and
   a state machine, coupled to the recovery unit for generating the acknowledgment signal according to the recovered signal.

3. The USB apparatus of claim 2, wherein the state machine determines whether the packet signal is a "Start of Frame" (SOF) signal or not according to the recovered signal.

4. The USB apparatus of claim 1, wherein the signal detecting unit comprises:
   a recovery unit, for generating at least a recovered signal based on detection of a defined bit pattern according to operation in an HS mode; and
   a state machine coupled to the recovery unit for generating the acknowledgment signal according to the recovered signal.

5. The USB apparatus of claim 1, wherein the frequency generating unit further comprises:
   a frequency synthesizer, for generating the output clock signal according to the adjusted clock signal and the control signal.

6. The USB apparatus of claim 1, wherein the reference clock generator comprises passive components and active components.

7. The USB apparatus of claim 6, wherein the reference clock generator comprises at least a resistor, a capacitor, and a current source.

8. The USB apparatus of claim 1, wherein the reference clock generator comprises a ring oscillator and a capacitor.

9. A Universal Serial Bus (USB) system, comprising:
   a USB apparatus, for receiving a packet signal transmitted from a USB host and generating a control signal, the USB apparatus comprising:
   a signal detecting unit, for detecting a packet signal transmitted from the USB host and generating an acknowledgment signal in response to a detection result indicating that the packet signal is a start of frame (SOF) packet signal, wherein the signal detecting unit is configured to operate according to an oversampling method in a first mode and a non-oversampling method in a second mode; and
   an error detecting unit, coupled to the signal detecting unit, for utilizing an output clock signal to count a time interval between two adjacent acknowledgment signals to generate a counting result and generating a control signal according to the counting result; and
   a frequency generating unit, coupled to the USB apparatus for generating the output clock signal according to the control signal, wherein the frequency generating unit comprises a reference clock generator for generating a first clock signal.

10. The USB system of claim 9, wherein the signal detecting unit comprises:
    a recovery unit, for generating at least a recovered signal according to the packet signal and based on the oversampling method according to operation in an LS/FS mode; and
    a state machine, coupled to the recovery unit, for generating the acknowledgment signal according to the recovered signal.

11. The USB system of claim 10, wherein the state machine determines whether the packet signal is a "Start of Frame" (SOF) signal or not according to the recovered signal.

12. The USB system of claim 9, wherein the frequency generating unit further comprises a fractional-N frequency synthesizer for generating a second clock signal according to the first clock signal and the control signal.

13. The USB system of claim 12, wherein the fractional-N frequency synthesizer comprises a phase locked loop and a fractional divider, the fractional divider coupled to a sigma-delta controller, wherein an output frequency of the frequency generating unit is based on adjusting the fractional divider while retaining a frequency of the first clock signal.

14. The USB system of claim 9, wherein the frequency generating unit further comprises:
    a fractional-N frequency synthesizer, for generating a second clock signal according to the first clock signal and the control signal; and
    a frequency synthesizer, for generating the output clock signal according to the second clock signal and the control signal.

15. The USB system of claim 9, wherein the reference clock generator comprises passive components and active components.

16. The USB system of claim 9, wherein the reference clock generator comprises a ring oscillator.

17. The USB system of claim 9, wherein the signal detecting unit comprises:
    a recovery unit, for generating, without oversampling, at least a recovered signal based on detection of a defined bit pattern according to operation in an HS mode; and
    a state machine coupled to the recovery unit for generating the acknowledgment signal according to the recovered signal.

18. The USB system of claim 9, wherein the output clock signal comprises a per interval quantity of clock cycles equal to a product of the time interval and a frequency of the output clock signal.

* * * * *